(12) United States Patent
Wittwer et al.

(10) Patent No.: US 7,616,077 B1
(45) Date of Patent: Nov. 10, 2009

(54) MICROELECTROMECHANICAL RESONATOR AND METHOD FOR FABRICATION

(75) Inventors: Jonathan W. Wittwer, Albuquerque, NM (US); Roy H. Olsson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 391 days.

(21) Appl. No.: 11/689,567

(22) Filed: Mar. 22, 2007

(51) Int. Cl.
*H03H 9/02* (2006.01)
*H03H 9/46* (2006.01)
(52) U.S. Cl. ..................................... 333/186
(58) Field of Classification Search .............. 333/186, 333/188, 200
See application file for complete search history.

(56) References Cited

U.S. PATENT DOCUMENTS

| | | | | |
|---|---|---|---|---|
| 5,281,935 | A * | 1/1994 | Knecht et al. ............... | 333/187 |
| 6,542,829 | B1 | 4/2003 | Gupta | |
| 6,744,174 | B2 | 6/2004 | Paden et al. | |
| 6,943,648 | B2 | 9/2005 | Maiz et al. | |
| 6,985,051 | B2 * | 1/2006 | Nguyen et al. ............... | 333/186 |
| 7,023,065 | B2 | 4/2006 | Ayazi et al. | |
| 7,068,126 | B2 * | 6/2006 | Huang et al. ................ | 333/188 |
| 7,319,372 | B2 * | 1/2008 | Pan et al. .................... | 333/197 |
| 2005/0206479 | A1* | 9/2005 | Nguyen et al. ............... | 333/186 |
| 2007/0046398 | A1* | 3/2007 | Nguyen et al. ............... | 333/186 |

OTHER PUBLICATIONS

Wan-Thai et al, "A Sub-Micron Capacitive Gap Process for Multiple-Metal-Electrode Lateral Micromechanical Resonators", Presented at the 14th IEEE International Conference on Micro Electro Mechanical Systems, 2001, pp. 349-352.
Rong Liu et al, "MEMS Resonators that are Rubust to Process-Induced Feature Width Variations", IEEE International Frequency Control Symposium and PDA Exhibition, 2001, pp. 556-563.
Rong Liu et al, "MEMS Resonators that are Rubust to Process-Induced Feature Width Variations", Journal of Microelectromechanical Systems, vol. 11, No. 5 Oct. 2002, pp. 505-511.
Ville Kaajakari et al, "Square-Extensional Mode Single-Crystal Silicon Micromechanical Resonator for Low-Phase-Noise Oscillator Applications", IEEE Electron Device Letters, vol. 25, No. 4, Apr. 2004, pp. 173-175.
Gianluca Piazza et al, "Dry-Released Post-CMOS Compatible Contour-Mode Aluminum Nitride Micromechanical Resonators for VHF Applications", Presented at the Solid-State Sensor, Actuator, and Micro Systems Workshop, Jun. 6-10, 2004, Hilton Head Island SC.

(Continued)

*Primary Examiner*—Benny Lee
*Assistant Examiner*—Alan Wong
(74) *Attorney, Agent, or Firm*—John P. Hohimer

(57) ABSTRACT

A method is disclosed for the robust fabrication of a microelectromechanical (MEM) resonator. In this method, a pattern of holes is formed in the resonator mass with the position, size and number of holes in the pattern being optimized to minimize an uncertainty $\Delta f$ in the resonant frequency $f_0$ of the MEM resonator due to manufacturing process variations (e.g. edge bias). A number of different types of MEM resonators are disclosed which can be formed using this method, including capacitively transduced Lamé, wineglass and extensional resonators, and piezoelectric length-extensional resonators.

19 Claims, 9 Drawing Sheets

OTHER PUBLICATIONS

Andryas Mawardi et al, "Design of Microresonators Under Uncertainty", Journal of Microelectromechanical Systems, vol. 14, No. 1, Feb. 2005, pp. 63-69.

Jonathan W. Wittwer et al, "Robust Design and Model Validation of Nonlinear Compliant Micromechanisms", Journal of Microelectromechanical Systems, vol. 15, No. 1, Feb. 2006, pp. 33-41.

Gavin K. Ho et al, "Process Compensated Micromechanical Resonators", MEMS 2007, Kobe, Japan, Jan. 21-25, 2007, pp. 183-186.

* cited by examiner

Section 1 - 1

110
Specifying a set of design parameters for the MEM resonator which includes a mass suspended above a substrate by at least one anchor

120
Providing a parametric computational model of the MEM resonator, and performing an uncertainty analysis with the parametric computational model over a range of expected manufacturing variations in at least one uncertainty parameter to determine an uncertainty $\Delta f$ in the resonant frequency $f_0$ due to the at least one uncertainty parameter

130
Specifying a pattern of holes in the mass to compensate, at least in part, for the uncertainty $\Delta f$ in the resonant frequency $f_0$ and repeating the uncertainty analysis to determine a change in the uncertainty $\Delta f$ due to the pattern of holes

140
Changing the pattern of holes by changing a location, a size or a number of the holes, and performing the uncertainty analysis to determine the change in the uncertainty $\Delta f$

150
Repeating step 140 until the uncertainty $\Delta f$ in the resonant frequency $f_0$ of the MEM resonator is minimized

100

FIG. 3

Section 2 - 2

MICROELECTROMECHANICAL RESONATOR AND METHOD FOR FABRICATION

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to microelectromechanical (MEM) devices and, in particular, to Lamé, wineglass and extensional mode bulk acoustic MEM resonators and to a robust method for fabricating these MEM resonators which compensates at least partially for fabrication process variations and thereby provides a resonant frequency which is substantially insensitive to the fabrication process variations.

BACKGROUND OF THE INVENTION

Microelectromechanical (MEM) resonators are being developed to miniaturize oscillators and filters for a number of applications including wireless communications and radio-frequency (RF) systems. MEM resonators are less bulky than the conventional quartz crystal and surface acoustic wave (SAW) oscillators which they can replace. Additionally, the MEM resonators can be fabricated using conventional semiconductor IC processes so that they can be directly integrated into an IC for reduced cost and size. Batch fabrication and the ability to place arrays of MEM resonators onto a single chip for use as filters and oscillators is also appealing for a number of high volume RF transceiver applications such as cell phones. For such applications, a frequency tolerance is required which is beyond that currently available with conventional MEM fabrication processes without post-fabrication laser trimming.

The present invention overcomes the limitations of the prior art by providing a method for designing and making MEM resonators which have a resonant frequency $f_0$ which can be made substantially insensitive to manufacturing variations including an edge bias. This is advantageous since profitable commercial production of batch-fabricated MEM resonators and other types of MEM devices relies on attaining a high reliability and a high fabrication yield. If such devices are not designed up-front to be robust to manufacturing variations, then exhaustive post-fabrication screening, calibration, or laser trimming is often required. The MEM resonators fabricated according to the present invention, which have a reduced manufacturing variation $\Delta f$ in the resonant frequency $f_0$, are expected to significantly reduce the need for post-fabrication screening, calibration and laser trimming.

These and other advantages of the present invention will become evident to those skilled in the art.

SUMMARY OF THE INVENTION

The present invention relates to a method for making a microelectromechanical (MEM) resonator having a resonant frequency $f_0$ which is substantially insensitive to variations in manufacturing. The method comprises the steps of: (a) specifying a set of design parameters for the MEM resonator which includes a mass suspended above a substrate by at least one anchor; (b) providing a parametric computational model of the MEM resonator, and performing an uncertainty analysis with the parametric computational model over a range of expected manufacturing variations in at least one uncertainty parameter, and thereby determining an uncertainty $\Delta f$ in the resonant frequency $f_0$ of the MEM resonator due to the at least one uncertainty parameter; (c) specifying a pattern of holes in the mass to compensate, at least in part, for the uncertainty $\Delta f$ in the resonant frequency $f_0$ of the MEM resonator, and repeating the uncertainty analysis with the parametric computational model to determine a change in the uncertainty $\Delta f$ in the resonant frequency $f_0$ of the MEM resonator due to the pattern of holes; (d) changing the pattern of holes by changing a location, a size or a number of the holes, and performing the uncertainty analysis with the parametric computational model to determine the change in the uncertainty $\Delta f$ in the resonant frequency $f_0$ of the MEM resonator; and (e) repeating step (d) until the uncertainty $\Delta f$ in the resonant frequency $f_0$ of the MEM resonator is minimized. The term "minimized" as used herein means reduced to or below an acceptable level. The acceptable level, which will depend upon a particular application for which the MEM resonator is used, can be for example ±10-100 parts-per-million (PPM) or less.

The step of specifying the set of design parameters can comprise specifying a size of the mass, and a size and a location of each anchor which suspends the mass above the substrate. The step of specifying the pattern of holes in the mass can comprise specifying a plurality of holes of a substantially equal size with a substantially equal spacing from a center of the mass. In certain embodiments of the present invention, the step of specifying the pattern of holes in the mass can comprise specifying a first set of holes having a first spacing from a center of the mass, and specifying a second set of holes having a second spacing from the center of the mass, with the second spacing being different from the first spacing. In these embodiments of the present invention, the first and second sets of holes will generally also have different sizes. The holes can also be located symmetrically about an axis of displacement of the mass.

Each pattern of holes in the mass is designed to compensate, at least in part, for one or more uncertainty parameters which can be an edge bias of the MEM resonator; a size of one or more of the anchors; a misalignment of one or more of the anchors; or a material property (e.g. Young's modulus, Poisson's ratio, density, etc.) of a material from which the MEM resonator is formed. The step of performing the uncertainty analysis for the MEM resonator can comprise: (i) modifying the value of one or more of the uncertainty parameters; (ii) calculating the resonant frequency $f_0$ using the parametric computational model of the MEM resonator; (iii) repeating steps (i) and (ii) for a plurality of different values of the uncertainty parameter(s) within the range of expected manufacturing variations of the uncertainty parameter(s); and (iv) calculating the uncertainty $\Delta f$ in the resonant frequency $f_0$ via error propagation.

The present invention also relates to a method for manufacturing a MEM resonator having a resonant frequency $f_0$ which is substantially insensitive to manufacturing variations in an edge bias in the MEM resonator. The method comprises the steps of: (a) specifying a size of a mass in the MEM and a size and a location of at least one anchor which suspends the mass above a substrate; (b) specifying a pattern of holes in the mass to compensate, at least in part, for the manufacturing variations in the edge bias in the MEM resonator; (c) modeling the MEM resonator using a parametric computational model including calculating an uncertainty $\Delta f$ in the resonant frequency $f_0$ due to a range of expected manufacturing variations in the edge bias in the MEM resonator; and (d) changing the pattern of holes in the mass, and repeating step (c) until the uncertainty $\Delta f$ in the resonant frequency $f_0$ of the MEM resonator due to the range of expected manufacturing variations in the edge bias in the MEM resonator is minimized.

In some embodiments of the present invention, the step of specifying the pattern of holes in the mass can comprise specifying a single set of holes of a substantially equal size having a substantially equal spacing from a center of the mass. In other embodiments of the present invention, the step of specifying the pattern of holes in the mass can comprise specifying a first set of holes of a first size and having a first spacing from a center of the mass, and specifying a second set of holes of a second size and having a second spacing from the center of the mass, with the second spacing being different from the first spacing. In these embodiments of the present invention where two sets of holes are used, the first size of holes will generally be different from the second size of holes. The step of specifying the pattern of holes in the mass can also comprise specifying a plurality of holes which can be located symmetrically about an axis of displacement of the mass.

The step of modeling the MEM resonator using the parametric computational model can comprise: (i) specifying a value of the edge bias of the MEM resonator within the range of expected manufacturing variations in the edge bias; (ii) calculating the resonant frequency $f_0$ using the parametric computational model of the MEM resonator; (iii) repeating steps (i) and (ii) for a plurality of values of the edge bias in the MEM resonator within the range of expected manufacturing variations in the edge bias; and (iv) calculating the uncertainty $\Delta f$ in the resonant frequency $f_0$ via error propagation.

The present invention further relates to a MEM resonator which comprises a substrate and a mass having a plurality of holes therein, with the mass being suspended above the substrate by at least one anchor to oscillate in a Lamé mode, a wineglass mode or an extensional mode at a resonant frequency $f_0$. Every hole in the mass can be located at the substantially the same distance from a center of the mass and can have a substantially identical hole size. The location and size of the holes are defined in order to compensate, at least in part, for an uncertainty $\Delta f$ in the resonant frequency $f_0$ due to manufacturing process variations. Every hole in the mass can also be located symmetrically about an axis of displacement of the mass. The MEM resonator also comprises a first set of electrodes located proximate to the mass to electrically stimulate the mass to oscillate at the resonant frequency $f_0$. A second set of electrodes can also be located proximate to the mass to sense the oscillation at the resonant frequency $f_0$.

In some embodiments of the present invention, the MEM resonator includes four anchors equally spaced about the mass, while in other embodiments of the present invention, the MEM resonator includes only a single anchor located beneath the center of the mass to suspend the mass above the substrate. The mass can be square or circular; and all the holes can be circular, or can have an arbitrary shape (e.g. elliptical, square, rectangular, etc.). In yet other embodiments of the present invention two anchors can be provided on either side of a rectangular mass.

The uncertainty $\Delta f$ in the resonant frequency $f_0$, which is at least partially compensated for by the holes in the mass, can be due to one or more uncertainty parameters, including an edge bias of the mass, a variation in thickness of the mass, a misalignment of one or more of the anchors relative to an axis of symmetry of the mass, a value of Young's modulus for a material used to form the MEM resonator, a value of Poisson's ratio for the material used to form the MEM resonator, and a density of the material used to form the MEM resonator.

The present invention also relates to a MEM resonator which comprises a mass suspended above a substrate by at least one anchor and having a first set of holes which are all of a first size, and a second set of holes which are all of a second size which is different from the first size, and with the sizes and locations of the first and second sets of holes being defined to provide an oscillation of the mass at a resonant frequency $f_0$ which is substantially independent of an edge bias in the MEM resonator. Together, the first and second sets of holes form a pattern of holes in the mass. The MEM resonator also comprises a first set of electrodes located on the substrate to electrically stimulate the oscillation of the mass at the resonant frequency $f_0$; and a second set of electrodes located on the substrate to sense the oscillation at the resonant frequency $f_0$.

The first set of holes can be rotated relative to the second set of holes by an angle which can be, for example, substantially equal to 45 degrees. The first set of holes can also be spaced at a first distance from a center of the mass which is different from a second distance from the center of the mass where the second set of holes are located. All the holes in the first and second sets of holes can be circular in shape, or can have an arbitrary shape (e.g. elliptical or polygonal). Additionally, all the holes in the first and second sets of holes can be located symmetrically about an axis of displacement of the mass. In certain embodiments of the present invention, the first set of holes can consist of four holes; and the second set of holes can also consist of four holes.

The number of anchors will depend upon the exact type of MEM resonator being formed. A single anchor can be located beneath the center of the mass to suspend the mass above the substrate, for example, to form a square extensional resonator, or a circular wineglass resonator. Four anchors equally spaced about a periphery of the mass to suspend the mass above the substrate can be used, for example, to form a Lamé resonator or a wineglass resonator, respectively, depending upon whether the mass is square or circular. A coupled resonator can be formed, for example, when the mass is square and suspended by three anchors connected at three corners of the mass, with the fourth corner of the mass being connected by a coupler to another square mass which is also suspended above the substrate with the second set of electrodes being formed thereabout.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 3 shows a flow diagram for the method of the present invention to make the uncertainty Δf in the resonant frequency $f_0$ of the MEM resonator relatively insensitive to variations in manufacturing.

DETAILED DESCRIPTION OF THE INVENTION

Figure 1A:
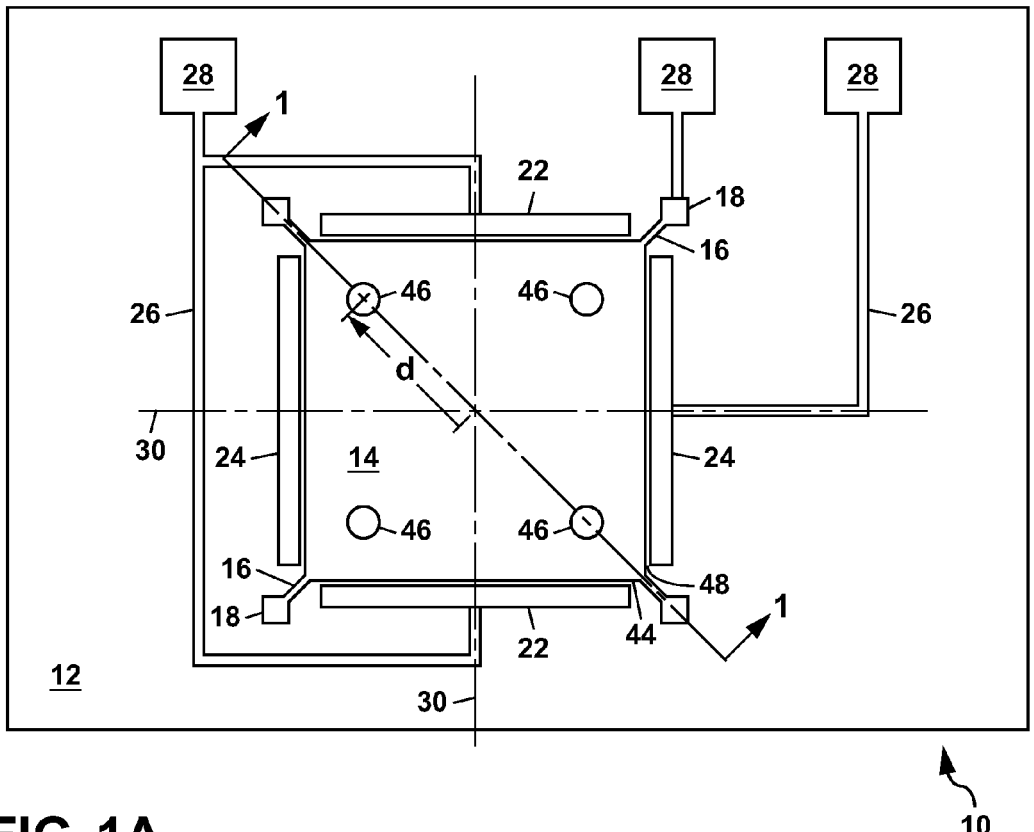
FIG. 1A shows a schematic plan view of an example of a MEM resonator formed according to the present invention.
Figure 1B:
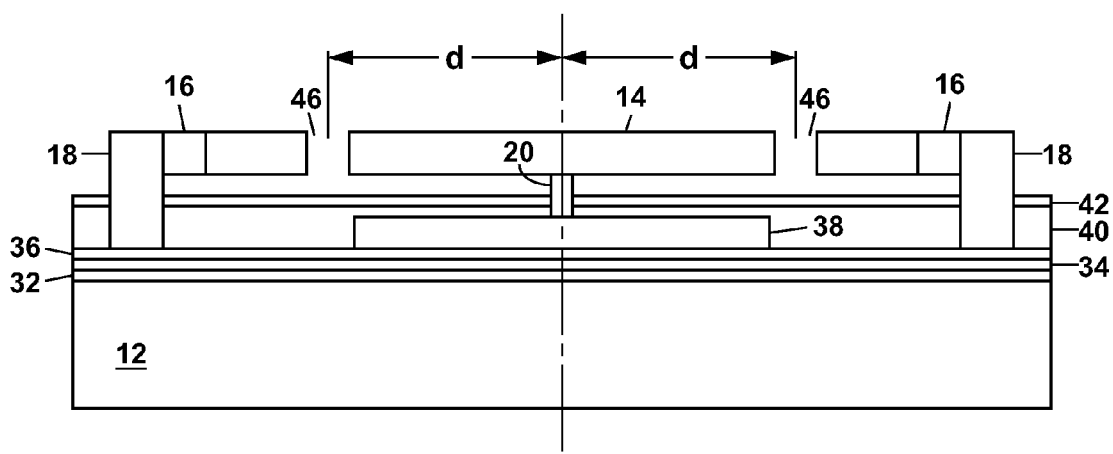
FIG. 1B shows an enlarged schematic cross-section view of the MEM resonator of FIG. 1A along the section line 1-1 in FIG. 1A.

FIG. 1A shows a schematic plan view of an example of a MEM resonator 10 formed according to the present invention; and FIG. 1B shows an enlarged schematic cross-section view of the same device 10 along section line 1-1 in FIG. 1A. The MEM resonator comprises a substrate 12 with a square mass 14 suspended thereabove by a plurality of anchors 16 which can be located at the corners of the square mass 14 which represent nodes in the displacement of the mass 14 during oscillation. Each anchor 16 in FIGS. 1A and 1B is elongate with a thickness substantially equal to the thickness of the mass 14, and is connected between the mass 14 and an anchor post 18 on the substrate 12. A central anchor 20 can also be optionally provided beneath a center of the mass 14 as shown in FIG. 1B to connect the center of the mass 14 (indicated by the dashed vertical line in FIG. 1B) to the substrate 12. The center of the mass 14 also represents a node in the displacement of the mass 14. The central anchor 20 is useful to limit a vertical movement of the mass 14. In other embodiments of the present invention, the mass 14 can be supported solely by the central anchor 20.

In the example of FIGS. 1A and 1B, a pair of input electrodes 22 are provided on opposite sides of the mass 14, which is also electrically biased, to electrically stimulate the mass 14 by capacitive transduction to oscillate in a Lamé mode at a resonant frequency $f_0$. A pair of output electrodes 24 can be located on the two remaining sides of the square mass 14 as shown in FIG. 1A to capacitively sense the oscillation of the mass 14 at the resonant frequency $f_0$. To operate the MEM resonator 10 as an oscillator, the mass 14 can be electrically biased with the input and output electrodes 22 and 24 being connected between the output and input, respectfully, of an amplifier using an RC network to restrict oscillation to a mode of the MEM resonator 10 for which the uncertainty Δf of the MEM resonator 10 has been optimized (i.e. minimized). To operate the MEM resonator 10 as a filter, the mass 14 can be electrically biased with an input signal being provided to the input electrodes 22 and with an oscillatory electrical output signal being generated at the output electrodes 22 for any frequency component of the input signal at the resonant frequency $f_0$.

Each set of electrodes 22 and 24 in the example of FIGS. 1A and 1B can be connected in parallel through wiring 26 to a contact pad 28 on the substrate 12 to allow external electrical connections to be made to the electrodes 22 and 24. The two output electrodes 24 in FIG. 1A can be connected in parallel through a doped polysilicon layer which can be located beneath the mass 14 and electrically isolated from the mass 14 and the substrate 12 by electrically-insulating layers (e.g. comprising silicon dioxide or silicon nitride). Additionally, the mass 14 can be electrically connected through one of the anchors 16 and anchor posts 18 to another contact pad 28 to allow an electrical bias voltage to be applied to the mass 14 and also to tune the resonant frequency by changing the electrical bias voltage. In other embodiments of the present invention, the electrodes 22 and 24 and the mass 14 can be connected to integrated circuitry which is formed on the same substrate 12 as the MEM resonator 10. Those skilled in the art will also understand that other alternatives are available for driving and sensing the oscillation of the MEM resonator 10.

As described above, the MEM resonator 10 in FIGS. 1A and 1B can oscillate either in a Lamé mode or in an extensional mode. A Lamé mode is characterized by the mass 14 dilating along one axis of displacement 30 in FIG. 1A, and contracting along an orthogonal axis of displacement 30. In an extensional mode, the mass 14 alternately dilates and contracts uniformly along these two axes of displacement 30 and also along an additional pair of axes of displacement 30 running through the corners of the square mass 14 (see FIG. 4D).

The MEM resonator 10 in the example of FIGS. 1A and 1B can be fabricated using conventional surface micromachining processes and built up layer by layer from a plurality of deposited and patterned material layers including polysilicon (i.e. poly-crystalline silicon), silicon nitride, and a sacrificial material such as silicon dioxide or a silicate glass (e.g. TEOS deposited from the decomposition of tetraethylorthosilicate). Each material layer can be deposited over the surface of the substrate 12 by low-pressure chemical vapor deposition (LPCVD) or plasma-enhanced chemical vapor deposition (PECVD) and then patterned by reactive ion etching using a photolithographically-defined etch mask.

In the example of FIGS. 1A and 1B, the substrate 12 can comprise an n-type silicon substrate with an electrical conductivity of 10-20 Ohm-cm. A 0.3 μm thick layer 32 of low-stress fine-grained polysilicon (termed Poly-0) can be blanket deposited over the substrate by LPCVD at a temperature of about 580° C. and doped during deposition with phosphorous. The same deposition temperature and doping type can be used for each polysilicon layer described herein. One or more annealing steps at about 1100° C. can also be used to reduce the residual stress in the polysilicon layers used to form the MEM resonator 10. The Poly-0 layer 32 serves as a ground plane beneath the MEM resonator 10.

A 0.3 μm thick oxide layer 34 comprising silicon dioxide or a silicate glass (e.g. TEOS) can be blanket deposited over the Poly-0 layer 32 by LPCVD followed by the deposition of a 0.3 μm thick layer 36 silicon nitride by LPCVD. One or more openings can be reactive ion etched through the layers 34 and 36, as needed, to make electrical connections to the Poly-0 ground plane.

A 1 μm thick layer 38 of polysilicon (termed Poly-1) can then be blanket deposited over the substrate 12 by LPCVD filling in the openings through the layers 34 and 36 and forming interconnections to the Poly-0 layer 32, as needed. The Poly-1 layer 38 can be patterned by reactive ion etching and used to build up the anchor posts 18 and the electrodes 22 and 24, and can also be used for the wiring 26 and contact pads 28. A portion of the Poly-1 layer 38 can be left in place beneath the mass 14 to provide a substrate attachment point for the central anchor 20 as shown in FIG. 1B.

A 2 μm thick layer 40 of silicon dioxide or a silicate glass (e.g. TEOS) can then be blanket deposited over the substrate 12 and over the Poly-1 layer 38. This layer 40 can then be planarized using a chemical-mechanical polishing step to provide a substantially planar surface.

A 0.5 μm thick layer 42 of silicon nitride can the be blanket deposited over the substrate 12 by LPCVD, followed by deposition of a 0.4 μm thick layer of a sacrificial material which can comprise silicon dioxide or a silicate glass (e.g. TEOS). In FIG. 1B, this latter sacrificial material layer, which defines an open space beneath the mass 14, has been removed to free up the mass 14 for movement. Openings can be formed through the silicon nitride layer 42 and the layer of the sacrificial material and also through the layer 40 down to the Poly-1 layer 38 in preparation for the deposition of one or more additional polysilicon layers which will be used to further build up the anchor posts 18, and also to form the mass 14 and the anchors 16 and 20. The silicon nitride layer 42 serves as an etch stop for later removal of the sacrificial material thereabove.

A 2.15 μm thick layer polysilicon (termed Poly-2) can then be blanket deposited over the substrate by LPCVD and patterned by reactive ion etching to form the mass 14, the anchors 16 and 20, and the anchor posts 18. A plurality of openings 46 can be etched completely through the Poly-2 layer. These openings 46, which are important for making the MEM resonator 10 robust to variations in manufacturing, will be described in detail hereinafter.

After patterning of the Poly-2 layer, another layer of the sacrificial material (e.g. silicon dioxide or TEOS) can be deposited by LPCVD to cover the mass 14 and fill in the openings 46 and also drape over each sidewall 44 of the mass 14 with a thickness that defines a capacitive transducer gap 48 which will be formed between the mass 14 and the electrodes 22 and 24 once this layer of the sacrificial material is removed. The capacitive transducer gap 48 can be, for example, 75-150 nanometers (nm) wide. The very small capacitive transducer gap 48 reduces the motional resistance $R_x$ of the MEM resonator 10 which is advantageous for impedance matching. In the example of FIGS. 1A and 1B, the capacitive transducer gap 48 is open to form a vacuum gap when the MEM resonator 10 is packaged under vacuum.

In other embodiments of the present invention, the capacitive transducer gap 48 can be closed with a deposited dielectric material such as silicon nitride or titanium nitride which can be substituted for the sacrificial material and left in place in the finished MEM resonator 10. In the case of titanium nitride, this material can be thermally oxidized and converted into titanium dioxide by a rapid thermal annealing step at a temperature of about 500° C. for about one minute. The silicon nitride or titanium dioxide which fills the gap 48 forms a solid capacitive transducer gap 48 which is useful to reduce the motional resistance $R_x$ of the MEM resonator 10 (by a factor $1/\epsilon^2$) and thereby improve impedance matching.

The electrodes 22 and 24 can then be formed by etching openings down through the various layers to expose the wiring 26 formed in the Poly-1 layer 38. Openings can also be made to expose the contact pads 28 at this time. A layer of polysilicon (termed Poly-3) about 3 μm thick can then be blanket deposited by LPCVD followed by deposition of a 0.1 μm thick aluminum layer by evaporation or sputtering. A hard mask comprising a layer of the sacrificial material can then be deposited above the Poly-3 and aluminum layers and patterned for use as an etch mask. The Poly-3 and aluminum layers can then be patterned by reactive ion etching to complete the electrodes 22 and 24 and also to complete the wiring 26 and contact pads 28 which can be built up from these layers. Although not shown in the schematic cross-section view of FIG. 1B, the electrodes 22 and 24 can optionally extend overtop the mass 14 slightly (e.g. by a fraction of a micron) to limit an upward extent of motion of the mass 14.

To complete the MEM resonator 10 in FIGS. 1A and 1B, the various layers of the sacrificial material can be removed down to the silicon nitride layer 42. This can be done using a selective etchant comprising hydrofluoric acid (HF) in liquid or vapor form which etches away the sacrificial material, but which does not substantially chemically attack the substrate 12 or the other materials used to form the MEM resonator 10.

The openings 46 provided through the Poly-2 layer can assist in exposing the sacrificial material beneath the mass 14 to hasten the removal of this sacrificial material using the HF etchant. However, this is not the primary purpose for the openings 46. The primary function of the openings 46 as will now be described in detail is to compensate for manufacturing uncertainties which can result in a range of frequencies $f_0$ for a number of different MEM resonators 10 of a given design.

Manufacturing uncertainties arise from a number of different uncertainty parameters which are related to processes used to form the MEM resonator 10. These uncertainty parameters include an edge bias which is due to variations in photolithography exposure, proximity and pattern density; and etching undercut. As defined herein, a positive edge bias corresponds to a decrease in lateral dimensions of the mass and thus results in material being removed from the edges of the mass 14 which, in turn, will increase the resonant frequency $f_0$.

Other uncertainty parameters include a variation in thickness of one or more material layers used to form the MEM resonator 10 due to variations in deposition rates, run-to-run drifts in deposition equipment, and uniformity across a wafer. Additional uncertainty parameters include variations in material parameters such as density, Young's modulus, Poisson's ratio, and residual stress of the polysilicon which is used to form the mass 14 and anchors 16 and 20 for the MEM resonator 10. Manufacturing uncertainties arising from the above uncertainty parameters can include both epistemic uncertainties which are due to a lack of knowledge about what certain parameters are or will be, and aleatory uncertainties which are due to natural unpredictable variations in parameters. For the Sandia National Laboratories' SUMMIT process used to fabricate the MEM resonators 10 described herein, the edge bias, which results in lateral dimensions in the MEM resonator 10 being smaller than design values, is commonly assumed to be 0.1 μm with a standard deviation of 0.04 μm. In the SUMMIT process, a standard deviation in thickness of deposited layers is 0.065 μm. Additionally, the following values for material parameters for polysilicon are expected using the SUMMIT process: Young's modulus E=164 GigaPascals (GPa) with a standard deviation of 3.2. GPa; Poisson's ratio ν=0.23; and residual stress $S_r$=−10 MegaPascals (MPa) compressive stress with a standard deviation of 5 MPa.

The above uncertainty parameters will result in an uncertainty Δf in the resonant frequency $f_0$ (i.e. a range of deviation in the resonant frequency from a target value $f_0$) for a number of different MEM resonators which is given by:

$$\Delta f = \frac{(|f_{+1} - f_0| + |f_{-1} - f_0|)}{f_0}$$

where $f_{+1}$ and $f_{-1}$ are maximum and minimum values of the resonant frequency, respectively, which result from opposite extremes expected for a particular uncertainty parameters during fabrication of the MEM resonators. The uncertainty Δf in the above equation represents a conservative deterministic estimate of uncertainty. When expressed in parts per million (PPM), the uncertainty Δf is given by:

$$\Delta f_{PPM} = \frac{(|f_{+1} - f_0| + |f_{-1} - f_0|)}{2 f_0} * 10^6$$

The uncertainty $\Delta f_{PPM}$ can be up to thousands of PPM which is disadvantageous for many applications. What is needed is a way of reducing the uncertainty $\Delta f_{PPM}$ in the resonant frequency $f_0$ down to an acceptable level, which in some cases, can be as low as ±10 PPM or less.

The most significant uncertainty parameter is the edge bias produced by fabrication processes such as photolithography and etching. For the MEM resonator 10 in FIGS. 1A and 1B, the edge bias results in deviations in the lateral dimensions of the mass 14 and the anchors 16 and 20 from their expected values (i.e. theoretical design values) by about 0.1±0.08 μm on a side. This changes the value of the mass 14 and also the geometry of the anchors 16 and 20. Since the mass and stiffness are coupled in the MEM resonator 14 of FIGS. 1A and 1B, the edge bias can have a dominant effect on the resonant frequency $f_0$.

To compensate for the uncertainty Δf in the resonant frequency $f_0$, a plurality of holes 46 can be provided in the mass 14 as schematically illustrated in FIGS. 1A and 1B. The discovery disclosed herein that the locations, size and number of the holes 46 in the mass 14 can affect the uncertainty Δf in the resonant frequency $f_0$ of the MEM resonator 10 is an unexpected result.

Heretofore any holes provided in the mass of a MEM resonator have been of a fixed location, size and number and have been provided solely for the purpose speeding up the removal of a sacrificial material located beneath the mass, and not for compensating for any uncertainty parameter that would affect the resonant frequency $f_0$ of the MEM resonator. In fact, the provision of an array of regularly-spaced holes in the mass of a MEM resonator for etching away the underlying sacrificial material can deleteriously affect the uncertainty Δf in the resonant frequency $f_0$ as will now be shown.

Figure 2:
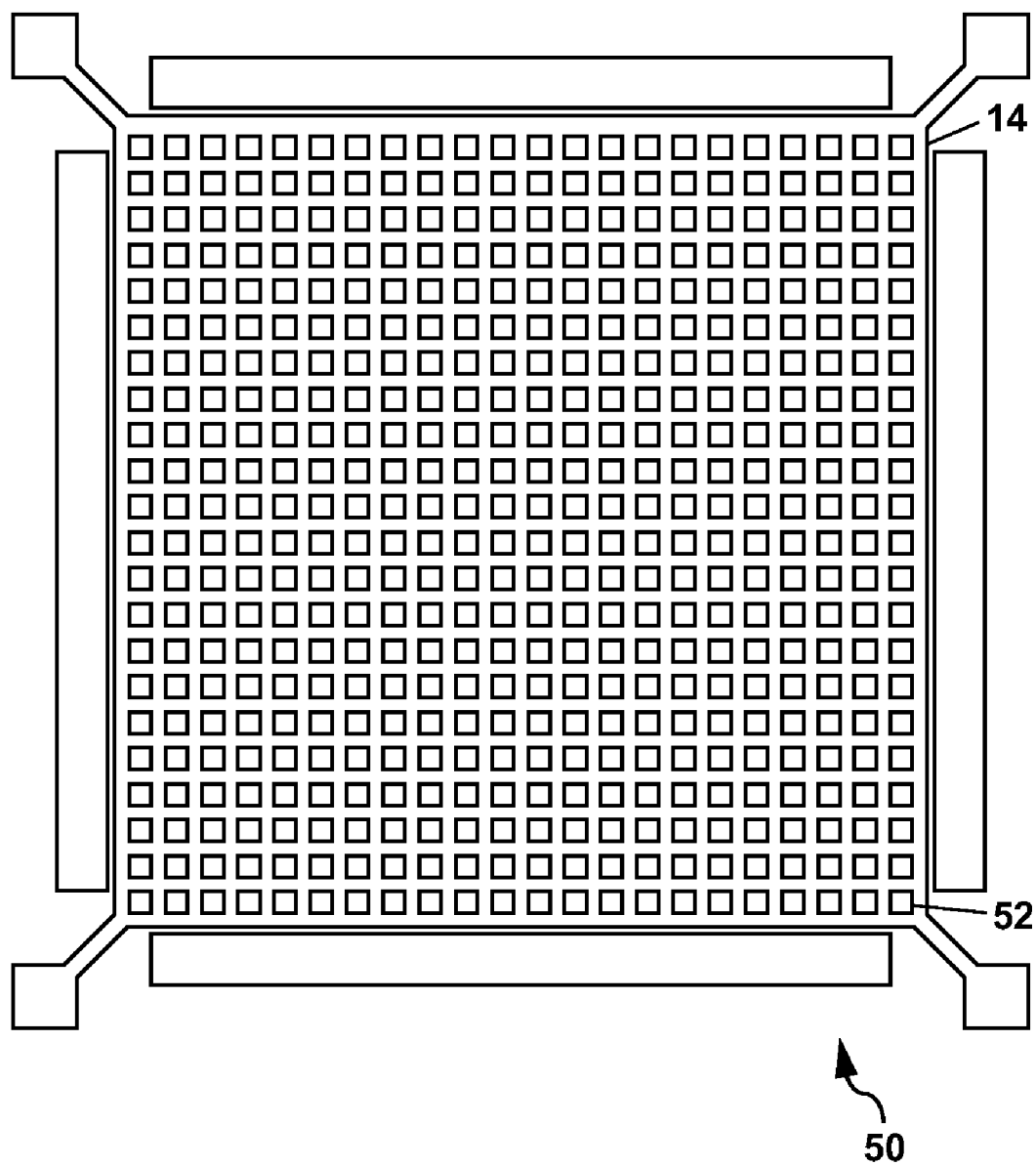
FIG. 2 shows a partial plan view of a MEM resonator having a mass with an array of holes therein to illustrate a case where the array of holes can generate a very large uncertainty $\Delta f$ in the resonant frequency $f_0$.

FIG. 2 shows a partial plan view of a MEM resonator 50 formed similar to the device 10 of FIGS. 1A and 1B, but with the mass 14 having an array of regularly-spaced holes 52 for use in removing the underlying sacrificial material to form the completed MEM resonator 50. For this MEM resonator 50, designed to operate in an extensional mode, a computer simulation using a parametric computational model of the MEM resonator 50 predicts that a variation in edge bias of ±0.1 μm will produce an unexpectedly large frequency variation of ±2.6 MHz which for a nominal resonant frequency $f_0$=57 MHz results in an uncertainty Δf=±45,600 PPM. This uncertainty Δf is hundreds of times larger than a fabrication goal of ±10 PPM for the MEM resonator 50. Uncovering the reason for the large uncertainty Δf due to the edge bias in the MEM resonator 50 in FIG. 2 led to the present invention.

According to the present invention, the number, size and locations of any holes located in the mass 14 must be carefully considered since the holes will affect the uncertainty Δf in the resonant frequency $f_0$ of a MEM resonator. The reason for this is that the holes are also subject to same edge bias as the periphery of the mass so that the edge bias changes the size of the holes. When the size of the holes changes due to the edge bias, this, in turn, changes both the mass and stiffness of the MEM resonator since the mass and stiffness are coupled. The changes in the mass and stiffness then change the resonant frequency $f_0$.

In order to make the MEM resonator 10 in the example of FIGS. 1A and 1B relatively insensitive to variations in manufacturing, the following method 100 can be used as set forth in FIG. 3. This method 100 in some instances can be applied only to the edge bias uncertainty parameter since the edge bias generally has the largest effect on the uncertainty Δf in the resonant frequency $f_0$. Alternately, the method 100 can be applied to a plurality of uncertainty parameters which have been listed above.

In a first step 110 of the method 100, a set of design parameters is specified for the MEM resonator 10. The set of design parameters includes a target value for the resonant frequency $f_0$ and the size (i.e. lateral dimensions and thickness) of the mass 14, the size of the anchors 16 and, and the size of any central anchor 20, if used. The set of design parameters can also include additional parameters which do not affect the resonant frequency $f_0$ but which are necessary to fabricate the completed device 10 of FIGS. 1A and 1B. These additional parameters include the size of the electrodes 22 and 24, the capacitive transducer gap 48 between the mass 14 and the electrodes 22 and 24, the shape of the wiring 26 and contact pads 28 and the thicknesses of the various deposited layers 32, 34, 36, 38, 40 and 42, and the thickness of the various layers of the sacrificial material which have been etched away in FIG. 1B to form the completed device 10.

In a second step 120 of the method 100 in FIG. 3, a parametric computational model of the MEM resonator 10 is provided. The parametric computational model of the MEM resonator 10 can be, for example, a 2-D or preferably a 3-D finite element analysis (FEA) model. Finite analysis computer codes, which can be used to develop the FEA model of the MEM resonator 10, are commercially available (e.g. ANSYS available from Ansys, Inc.), and can run on a personal computer.

In the parametric computational model of the MEM resonator 10 of the present invention, a solid model of the MEM resonator 10 is generated with the MEM resonator then being discretized with appropriate boundary conditions (e.g. zero displacements at the anchors 16 and 20 for a fundamental Lamé or wineglass mode; and non-zero forces on the sides of the mass 14 adjacent to the input electrodes 22) and material parameters applied. Numerical analysis are then performed using the parametric computational model to calculate the resonant frequency $f_0$ for a particular mode of interest (generally the fundamental mode). Those skilled in the art will understand that since the MEM resonator 10 in the example of FIGS. 1A and 1B is symmetric about the axes of displacement 30, then the parametric computational model of the MEM resonator 10 can be simplified to model only one-quarter of the mass 14 and anchors 16 and 20.

Once the MEM resonator 10 has been modeled using the parametric computational model, the set of design parameters can be adjusted, if needed, to approach the target value of the resonant frequency $f_0$ which can be, for example, in the range of 20-80 MHz. For some applications of the MEM resonator 10, the exact value of the resonant frequency $f_0$ is not critical so long as the uncertainty Δf is within an acceptable limit (e.g. ±10-100 PPM). For other applications, a precise value for the resonant frequency $f_0$ is needed with the uncertainty Δf also being within the acceptable limit. This may require one or more additional revisions of the set of design parameters after adding a pattern of holes 46 to the MEM resonator 10 in step 130 below, and as the pattern of holes 46 is changed one or more times as set forth in steps 140 and 150 below.

In a third step 130 of the method 100 of the present invention, the pattern of holes 46 in the mass 14 are specified. This pattern of holes 46 is designed to compensate to a large extent for the uncertainty parameters which are responsible for the uncertainty Δf in the resonant frequency $f_0$. The pattern of holes 46 comprises a plurality of holes which are located symmetrically about the axes of displacement 30 as shown in FIG. 1A. For the example of FIGS. 1A and 1B, the pattern of holes 46 comprises a set of four holes which are symmetric about the axes of displacement 30 with a substantially identical spacing d from the center of the mass 14. The exact spacing d and the size of the holes 46, which can be circular, is somewhat arbitrary since the method 100 of the present invention can iteratively re-locate and re-size the holes 46 to optimize the MEM resonator 10 to minimize the uncertainty Δf in the resonant frequency $f_0$. If the uncertainty Δf at that point is still above an acceptable level, then additional holes 46 can be added to the pattern and the method 100 can continue until the uncertainty Δf in the resonant frequency $f_0$ is minimized to or below the acceptable level. An initial size for the holes 46 can be, for example, 5-10 μm.

After specifying the pattern of holes 46 in the mass 14, an uncertainty analysis is performed using the parametric computational model of the MEM resonator 10. This uncertainty analysis can be performed, for example, using an optimization toolbox provided in MATLAB software (available from The Mathworks, Inc.) which can be linked to the ANSYS finite analysis computer code. The uncertainty analysis can initially be performed for the edge bias in the MEM resonator 10, and then for other of the uncertainty parameters which have been previously described. For each uncertainty parameter, the resonant frequency of the MEM resonator 10 can be determined with the parametric computational model for each of a plurality of different values of the uncertainty parameter within a range of expected manufacturing variations (e.g. the range of 0-0.2 μm for the edge bias, or a range of about 1-10% change in the uncertainty parameter when there is no information about the range of expected manufacturing variations for the uncertainty parameter). After calculating the change in the resonant frequency of the MEM resonator 10 due to the range of expected manufacturing variations for one or more of the uncertainty parameters, the uncertainty Δf in the resonant frequency $f_0$ can be calculated via error propagation using the parametric computational model and compared with the uncertainty Δf without the pattern of holes 46.

In step 140 of the method 100, the pattern of holes 46 can then be changed by changing the location or size of the holes, or by changing the number of holes in the pattern. Guidance for changing the pattern of holes 46 can be obtained from the uncertainty analysis performed under step 130 above.

For example, when the edge bias is positive (i.e. more material is removed from the periphery of the mass to reduce a magnitude of the mass as the edge bias is increased) and the resonant frequency increases with increasing values of the positive edge bias, this indicates that the pattern of holes 46, which also increase in size due to the positive edge bias therein, is affecting a magnitude of the mass 14 more than a stiffness of the mass 14 so that the holes 46 should be relocated toward regions of higher strain and lower displacement of the mass 14 as calculated with the parametric computational model. When the edge bias is positive and the resonant frequency decreases with increasing values of the positive edge bias, then this indicates that the pattern of holes 46 is affecting the stiffness of the mass 14 more than the magnitude of the mass 14 so that the pattern of holes 46 should be shifted to regions of lower strain and higher displacement of the mass 14. If the resonant frequency increases with increasing values of the uncertainty parameter and then decreases with further increasing values of the uncertainty parameter, this can indicate that a second order effect is dominant. In general, the goal of the optimization method 100 presented herein is to re-position and re-size the pattern of holes 46 to reduce the first and second derivatives of the resonant frequency with respect to each uncertainty parameter to zero (i.e. $\delta f_0/\delta u=0$ and $\delta^2 f_0/\delta u^2=0$ where u is an uncertainty parameter), or to as small a value as is possible. Contour maps of the displacement and strain can be generated using the parametric computational model of the MEM resonator 10 to aid in the relocation of the pattern of holes 46.

In step 150 of the method 100 of the present invention, step 140 can be repeated as many times as needed until the uncertainty Δf in the resonant frequency $f_0$ is minimized (i.e. reduced to an acceptable value) with the location, size or number of holes 46 in the pattern being changed each time. This is an iterative procedure in which the uncertainty Δf is calculated after each change in the pattern of holes 46 and compared with the uncertainty Δf prior to making the change to see whether the uncertainty Δf is improved or worsened by the change. This information can then be used to determine how the pattern of holes 46 should be changed for a further iteration. If movement of the holes 46 in one direction along a line between the holes 46 and the center of the mass 14 reduces the uncertainty Δf, then the next iteration can move the pattern of holes 46 further towards the center of the mass 14 until the uncertainty Δf is minimized with respect to the location of the holes 46. If the uncertainty Δf is worsened, the pattern of holes 46 can be moved outward along this line away from the center of the mass 14 until the uncertainty Δf is minimized. Similarly, the size of the holes 46 can be increased or decreased until the uncertainty Δf in the resonant frequency $f_0$ is minimized.

If the uncertainty Δf is still above an acceptable value (e.g. ±10-100 PPM) after optimizing the location and size of the initial set of holes 46 in the pattern, then another set of holes 46 can be added to the pattern. As an example, this second set of holes 46 can comprise four or eight holes which are symmetric about the axes of displacement 30, and which are each located at a different distance d' from the center of the mass 14 (see FIGS. 4B and 4D). This second set of holes 46 can be located, for example, substantially in-line with the first set of holes, or rotated at an angle (e.g. 45°) with respect to the first set of holes 46. After adding the second set of holes 46 to the pattern, step 140 can be repeated, as needed, to optimize the uncertainty Δf. After optimization of the uncertainty Δf, the size of each hole in the second set of holes will generally be different from the size of each hole in the first set of holes. Also, generally, only two sets of holes 46 are needed to optimize the uncertainty Δf in the resonant frequency $f_0$ when the mass 14 is square or round. However, in the event that the uncertainty Δf is still above the acceptable value, then one or more additional sets of holes 46 can be added and step 140 repeated again, as needed.

It should be noted that the method 100 of the present invention optimizes the manufacturability of the MEM resonator 10 for a single specific frequency of oscillation (e.g. the fundamental frequency). The method 100 of the present invention can be applied to many different types of MEM resonators 10 including devices similar to that of FIGS. 1A and 1B with a square mass 14 which can operate either in a Lamé mode or in an extensional mode, and also to MEM resonators 10 formed with a circular mass 14 which can be operated in a wineglass mode or an extensional mode. The method 100 of the present invention can further be used to optimize the manufacturability of length-extensional mode MEM resonators having a rectangular mass 14 suspended by two anchors 16 located on either side of the mass 14 (see FIGS. 7A and 7B). The method 100 can also be applied to optimize the manufacturability of coupled MEM resonators which can comprise a pair of suspended square or circular masses 14 which are connected together by a coupler 66 (see FIG. 6).

A series of examples will be presented hereinafter to illustrate operation of the method 100 to optimize the uncertainty $\Delta f$ in the resonant frequency $f_0$ for different types of MEM resonators 10 as described above. For clarity, the wiring 26 and contact pads 28 have been omitted from the schematic plan views of the examples presented hereinafter in FIGS. 4A-4F, 5, 6 and 7A.

In the examples presented hereinafter, all the holes 46 are shown as being circular. This can be advantageous for fabrication since circular holes 46 are less likely to change shape during fabrication of the MEM resonator due to limitations in MEM processing such as a limited photolithographic resolution which can round sharp corners. However, those skilled in the art will understand that other shapes can be used for the holes 46 according to the present invention, including elliptical and polygonal shapes.

Figure 4A:
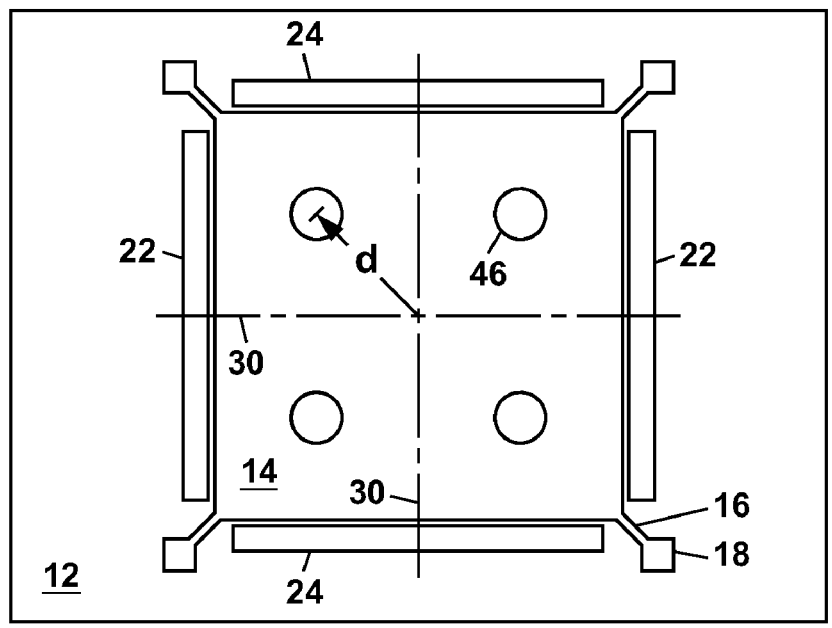
FIGS. 4A-4F show partial schematic plan views of examples of different types of MEM resonators which can be formed according to the present invention.

FIG. 4A shows a schematic plan view of the mass 14 and anchors 16 for a square Lamé mode MEM resonator 10 which is formed according to the present invention and designed to operate at about 52 MHz. This MEM resonator 10 is similar to that of FIGS. 1A and 1B except that the central anchor 20 is omitted since it can add significantly to the uncertainty $\Delta f$, limiting the uncertainty $\Delta f$ to about ±350 PPM. The most dominant effect of the central anchor 20 on the uncertainty $\Delta f$ is not due to the edge bias of the central anchor 20, but instead is due to an uncertainty in alignment of the central anchor 20 precisely at the location of the center of the mass 14. For the device 10 of FIG. 4A with a 67.5 µm square mass 14, the method 100 of the present invention allows an optimum pattern of holes 46 to be determined to make fabrication of this device 10 substantially insensitive to fabrication process variations by reducing the uncertainty $\Delta f$ to about ±17 PPM as calculated with the parametric computational model when a pattern of four holes 46 is provided in the mass 14 as shown in FIG. 4A. In the pattern of holes 46 for this device 10 after optimization with the method 100, each hole 46 is 7.56 µm in diameter and is located 15.97 µm away from each axis of displacement 30 (i.e. a distance d=22.59 µm from the center of the mass 14).

For a 75 nm capacitive transducer air gap 48, the Lamé mode MEM resonator 10 of FIG. 4A has a measured resonant frequency $f_0$=52.19 MHz and a motional resistance $R_x$=8.8 kiloOhms (kΩ) with a bias voltage of 5 Volts applied to the mass 14. The quality factor Q for this device measured under the above operating conditions and under vacuum is about 97,000. The signal level at the output electrodes 24 is about 30 millivolts (mV) peak to peak.

By adding an additional set of holes 46 to the pattern of holes 46 in a MEM resonator 10 similar to that shown in FIG. 4A and optimizing the location and size of each set of holes 46 using the method 100 of the present invention, the uncertainty $\Delta f$ due to edge bias can be further reduced to about ±0.25 PPM. This is schematically illustrated in the plan view of FIG. 4B, where the additional set of holes 46 comprises eight holes 46 which are located symmetrically about the axes of displacement 30 at a different distance d' from the center of the mass 14, and with a different hole size.

Figure 4B:
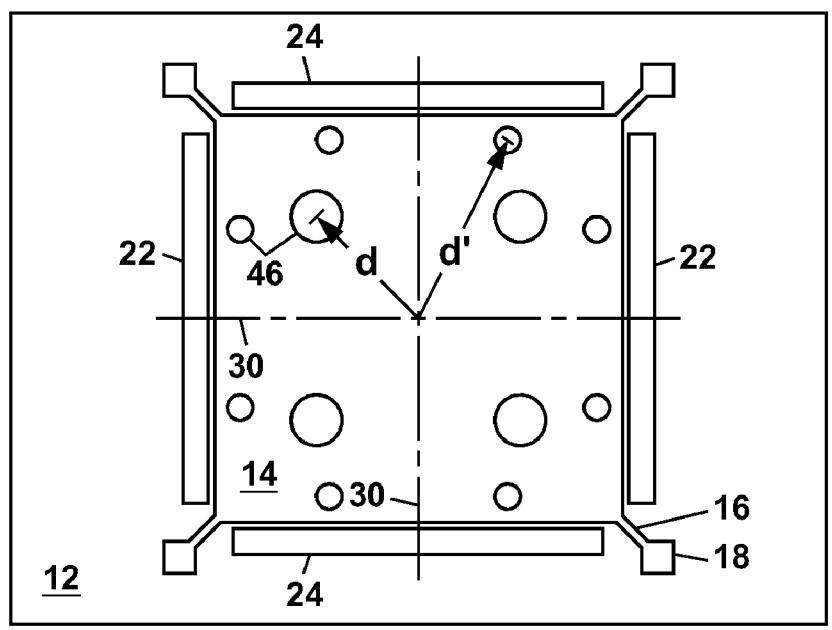

For the MEM resonator 10 of FIG. 4B, the mass 14 is 70 µm on a side to provide a calculated resonant frequency $f_0$=50.6 MHz. A first set of four holes 46 is located at a distance d=17.7 µm from the center of the mass 14 with a hole diameter of 5.95 µm. Each hole 46 in the first set of holes 46 is also located at a distance of 12.5 µm from each axis of displacement 30 (i.e. at an angle of 45° with respect to each axis 30). A second set of eight holes 46 is located at a distance d'=31.6 µm with a hole diameter of 3.85 µm. Each hole 46 in the second set of holes 46 is also located at a distance of about 11.5 µm from one of the axes of displacement 30 (i.e. at an angle of 21.67° from that axis 30). The anchors 16 are 2 µm wide and 9.5 µm long, with the anchor posts 18 being 7 µm square. No central anchor 20 is present in this device 10.

Figure 4C:
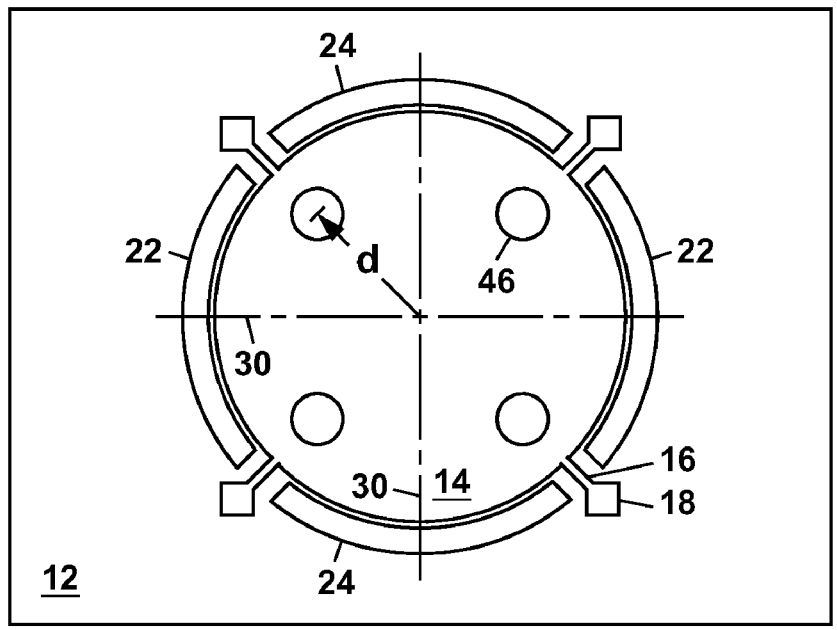

FIG. 4C shows a schematic plan view of a wineglass resonator 10 formed according to the present invention with a circular mass 14. The wineglass resonator 10 operates similarly to the Lamé mode resonator 10 of FIG. 4A, with the mass 14 dilating along one axis of displacement 30 and contracting at the same time along the other axis of displacement 30, and with the anchors 16 being located at nodal points of the MEM resonator 10. The wineglass resonator 10 can be analyzed with the parametric computational model in a manner similar to that of the device 10 of FIG. 4A. A pattern of holes 46 comprising four identically-sized holes equally spaced apart at a distance d from the center of the mass 14 can then be provided in the parametric computational model of the wineglass resonator and then re-positioned and re-sized using the method 100 of the present invention to arrive at a configuration which minimizes the uncertainty $\Delta f$ in the resonant frequency $f_0$ in a manner similar to that described above with reference to FIG. 4A. The exact size and spacing of the pattern of holes 46 for the wineglass resonator 10 in FIG. 4C will generally depend upon the resonant frequency $f_0$ and can be learned from practice of the present invention. Additionally, the size and spacing of the pattern of holes 46 for the wineglass resonator 10 in FIG. 4C can be different from the size and spacing for the holes 46 in the square Lamé mode MEM resonator 10 of FIG. 4A even though both types of devices are designed to operate at the same resonant frequency $f_0$.

Figure 4D:
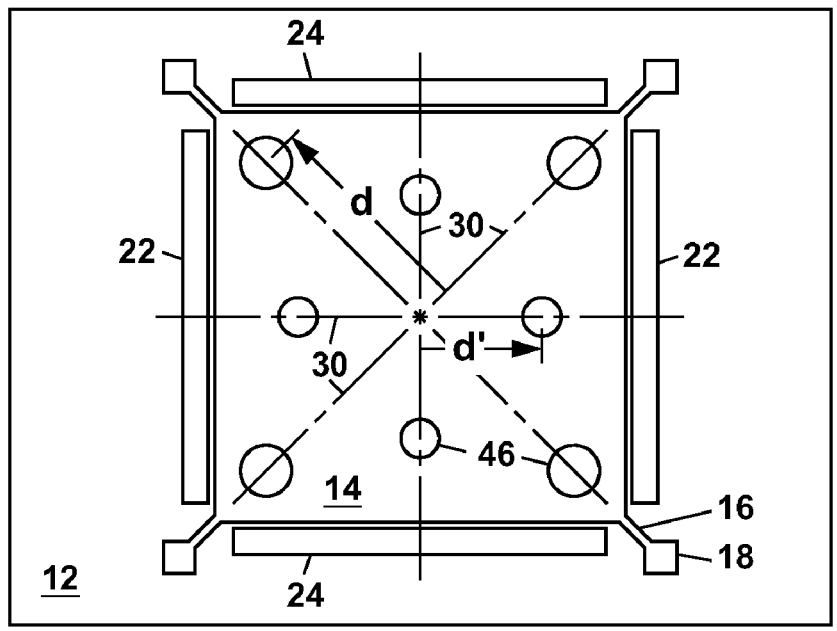

FIG. 4D shows a schematic plan view of the mass 14 and anchors 16 for a square extensional mode MEM resonator 10 which is formed according to the present invention and designed to operate at 70 MHz. This MEM resonator 10 is also formed as previously described with reference to FIGS. 1A and 1B and can optionally include a central anchor 20. The square extensional mode MEM resonator 10 in FIG. 4D can also be driven electrostatically using two input electrodes 22 on opposite sides of the mass 14, and two output electrodes 24 on the other two sides of the mass 14, with the mass 14 also being electrically biased. Operation of this device 10 is characterized by a relatively uniform dilation and contraction of all sides and corners of the mass 14 which preserves the shape of the square mass 14 while it alternately dilates and contracts at the resonant frequency $f_0$. Since the corners of the mass 14 in FIG. 4D are displaced together with the sides of the mass 14, then four axes of displacement 30 are appropriate. This is in contrast to the Lamé mode device 10 of FIG. 4A which requires only two axes of displacement since for the Lamé mode device 10 the anchors are located at nodal points of the displacement.

In the example of FIG. 4D, the pattern of holes 46 after optimizing the manufacturability of the square extensional mode MEM resonator 10 using the method 100 of the present invention can comprise two sets of four holes 46, with all the holes 46 in an outer set of holes 46 having a diameter of 8 µm and being located at a distance d=36.4 µm from the center of the mass 14, and with all the holes 46 in an inner set of holes 46 having a diameter of 6.85 µm and being located at a distance d'=20 µm from the center of the mass 14. Each set of holes 46 is located symmetrically about the axes of displacement 30 of the square mass 14.

After optimization of the manufacturability of the MEM resonator 10 in FIG. 4D using the method 100 of the present invention and without re-sizing the mass 14 after adding the pattern of holes 46, the calculated resonant frequency $f_0$ is 68.5 MHz. The calculated uncertainty $\Delta f$ in the resonant frequency $f_0$ for this device 10 can range from ±10-350 PPM depending upon how the anchor posts 18 are modeled. For this extensional mode device 10, the corners of the square mass 14 dilate and contract and thus are strongly coupled to the anchors 16 and anchor posts 18. In this example of the present invention, the anchors 16 can have a width of, for example, 2.5 μm, a length of 14 μm and a thickness equal to the thickness of the mass 14 (i.e. 2.15 μm). To better isolate the anchor posts 18 from the mass 14, the anchors 16 can be made with a length substantially equal to one-quarter of an acoustic wavelength at the frequency of oscillation $f_0$ (see FIG. 5).

Figure 4E:
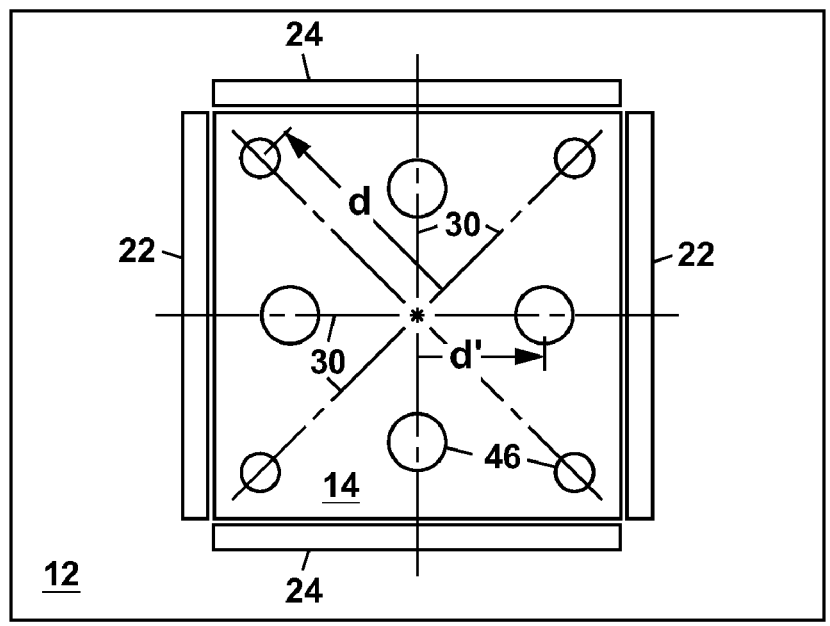

FIG. 4E shows a square extensional mode MEM resonator 10 in which the mass 14 is supported solely by a central anchor 20 located beneath the center of the mass 14 (see FIG. 1B). For this example of the present invention, the mass 14 is square with lateral dimensions of 67.5 μm; and the central anchor 20 is cylindrical with a diameter of 4 μm. The target frequency $f_0$ for this MEM resonator 10 is 62 MHz. The pattern of holes 46 required to optimize this device 10 for manufacturability using the method 100 of the present invention uses two sets of holes 46 similar to those in FIG. 4D, but with different sizes and locations for the holes 46 than in FIG. 4D. For the device 10 of FIG. 4E, the outer set of holes 46 comprises four holes 46 which are each 6.75 μm in diameter and located at a distance of 37.8 μm from the center of the mass 14. The inner set of holes 46 also comprises four holes 46 which are each 10.04 μm in diameter and located 19 μm from the center of the mass 14. Both the inner and outer sets of holes 46 are located symmetrically with respect to the axes of displacement 30 of the mass 14. For this MEM resonator 10, the uncertainty $\Delta f$ in the resonant frequency $f_0$ due to the edge bias of the mass 14 can be reduced to ±0.3 PPM as calculated with the parametric computational model for the pattern of holes 46 shown in FIG. 4E. There is also an edge bias due to the size of the central anchor 20 which according to the parametric computational model can result in an uncertainty $\Delta f$ of about ±25 PPM. With this device 10 optimized for manufacturability without re-sizing the mass 14, the resonant frequency $f_0$ is calculated to be 62.2 MHz.

Figure 4F:
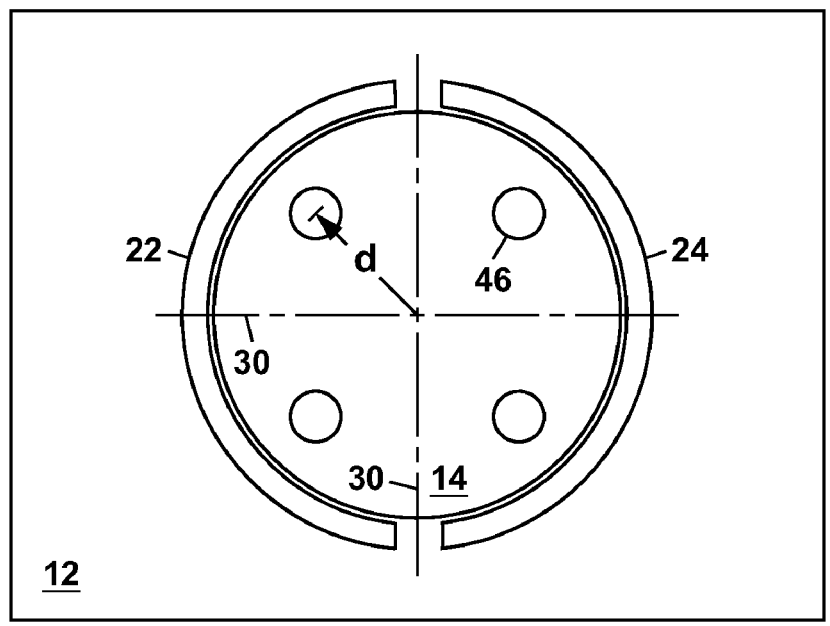

The present invention can also be used to form a circular extensional mode MEM resonator 10. An example of such a device 10 is shown in FIG. 4F. In FIG. 4F, the mass 14 is circular with a semi-circular input electrode 22 and a semi-circular output electrode 24 surrounding the mass 14, and with the mass 14 being supported by only a single central anchor 20 beneath the center of the mass 14. Since the circular mass 14 uniformly dilates and contracts all around while oscillating in the extensional mode, the location and number of the axes of symmetry 30 is somewhat arbitrary for this type of device 10 and can be selected after specifying the number of holes 46 to be provided in the pattern of holes. In the example of FIG. 4F, a pattern of four holes 46 is used, with the holes 46 being spaced uniformly around the circular mass 14 at a spacing d from the center of the mass 14. The holes 46 are located symmetrically about a pair of axes of symmetry 30 which are aligned symmetrically about the electrodes 22 and 24. One or more additional sets of holes 46 (not shown) can be provided in the mass 14, if needed, to reduce the uncertainty $\Delta f$ in the resonant frequency $f_0$ to an acceptable level. The number, location and size of the holes 46 in each set of holes can be optimally determined according to the method 100 of the present invention.

In the examples of FIGS. 4A-4F, the pattern of holes 46 which is provided in the mass 14 to optimize the uncertainty $\Delta f$ in the resonant frequency $f_0$ also provides access to the underlying sacrificial material during manufacturing of the MEM resonator 10 so that the sacrificial material can be readily removed by the HF etchant. For other MEM resonators 10 of the present invention which are designed to operate at lower frequencies, the spacing between the holes 46 may be larger than desired for removal of the underlying sacrificial material. For these lower-frequency devices 10, an array of etch-release holes 54 can be initially provided in the mass 14 during step 110 when the set of design parameters for the MEM resonator 10 is specified. The array of etch-release holes 54 are used solely for use in removing the underlying sacrificial material; and any uncertainty in manufacturing due to the array of etch-release holes 54 can be compensated for by the method 100 of the present invention using the pattern of holes 46. The etch-release holes 54 do not form a part of the pattern of holes 46, and are not used to optimize the uncertainty $\Delta f$. Thus, during application of the method 100 to reduce the uncertainty $\Delta f$ in the resonant frequency $f_0$ as the pattern of holes 46 is resized, repositioned, or changed in number, the array of etch-release holes 54 is kept fixed in size, location and number. The etch-release holes 54 can be circular, square, or of an arbitrary shape.

Figure 5:
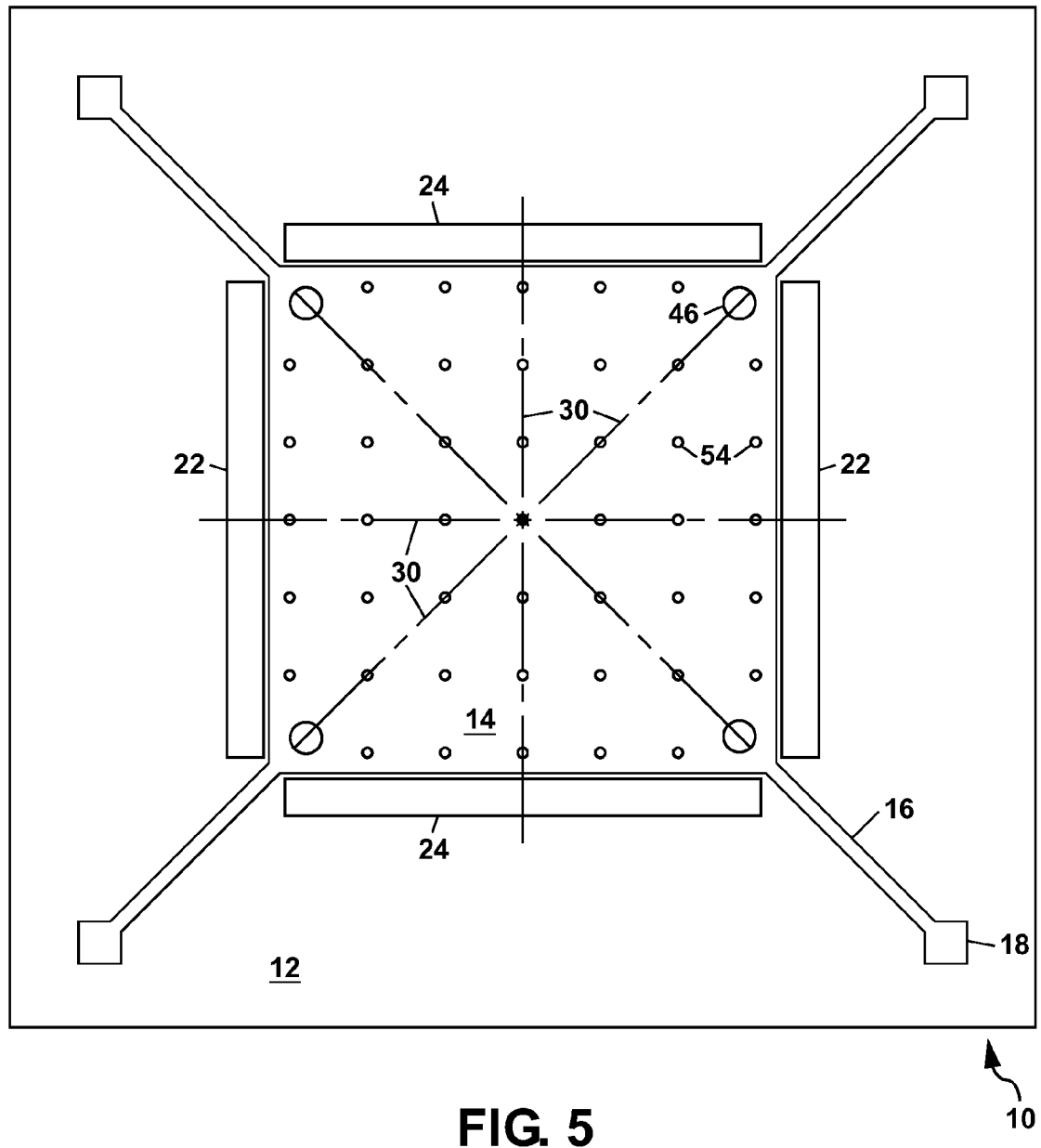
FIG. 5 shows a partial schematic plan view of an example of a MEM resonator formed according to the present invention with an array of etch-release holes in addition to the pattern of holes used to reduce the uncertainty Δf in the resonant frequency $f_0$.

FIG. 5 shows partial schematic plan view of an example of a MEM resonator 10 having an array of etch-release holes 54 in addition to the pattern of holes 46 used to minimize the uncertainty $\Delta f$ in the resonant frequency $f_0$. In FIG. 5, the wiring 26 and contact pads 28 have been omitted for clarity. In FIG. 5, adjacent holes 54 in the array of etch-release holes 54 are spaced apart by a distance of 30 μm in the mass 14 which is 200 μm wide. The holes 54 in the array of etch-release holes 54 have been omitted at the corners of the square mass 14 in FIG. 5 where the holes 46 are located since the holes 46 provide access to the underlying sacrificial material for the HF etchant. The etch-release holes 54 in this example are all circular with a diameter of 4 μm.

In the device 10 of FIG. 5, which is designed to operate in a extensional mode at a target frequency of $f_0$=20 MHz, the anchors 16 each have a width of 8 μm and a length of 89 μm. The length of the anchors 16 corresponds to one-quarter of an acoustic wavelength at the oscillation frequency $f_0$ for the polysilicon used to form the anchors 16 and mass 14. By making the anchors 16 one-quarter acoustic wavelength long, the acoustic isolation between the mass 14 and the anchor posts 18 is substantially improved.

The MEM resonator 10 of FIG. 5 can be fabricated as previously described with reference to FIGS. 1A and 1B and can be optimized with the method 100 of the present invention. The MEM resonator 10 in FIG. 5 can be operated in a Lamé using two of the electrodes on opposite sides of the mass 14 as input electrodes 22, with the other two electrodes serving as output electrodes 24. The mass 14 can be electrically biased by an electrical connection formed through one of the anchors 16 and anchor posts 18.

The pattern of holes 46 needed to optimize the uncertainty $\Delta f$ in the resonant frequency $f_0$ for the MEM resonator 10 in FIG. 5 comprises a set of four holes 46 with each hole 46 having a diameter of 12 μm and being located symmetrically about the axes of displacement 30 at a distance d=120 μm from the center of the mass 14. For this pattern of holes 46, the calculated resonant frequency $f_0$ is 19.8 MHz without re-sizing the mass 14 to account for the pattern of holes 46, and the calculated uncertainty is reduced to $\Delta f \sim \pm 25$ PPM after optimization with the method 100 of the present invention.

Figure 6:
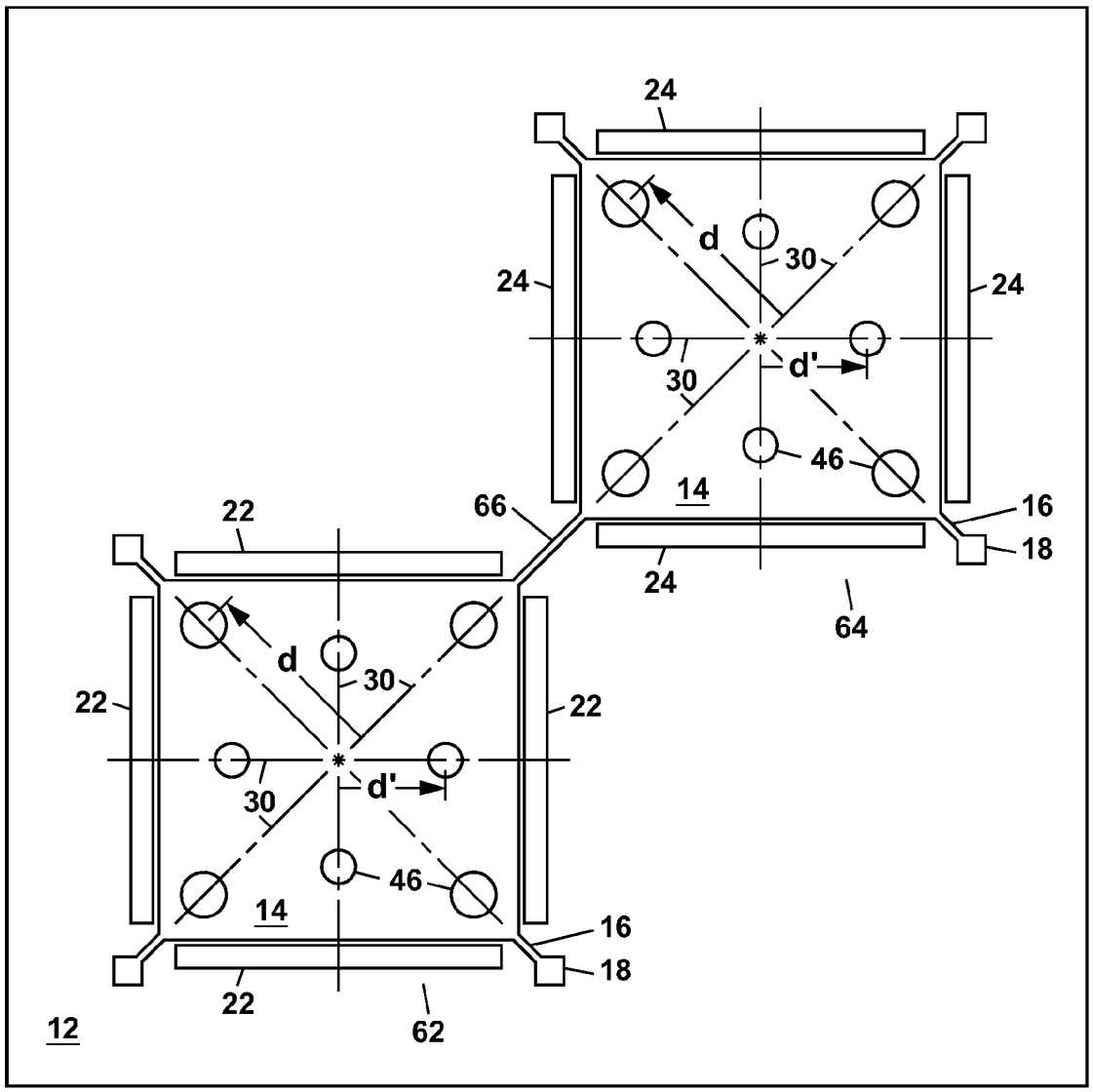
FIG. 6 shows a partial schematic plan view of a coupled MEM resonator formed according to the present invention.

FIG. 6 shows a schematic plan view of an example of a coupled MEM resonator 60 according to the present invention which operates in an extensional mode. The coupled MEM resonator 60 with two coupled masses is useful to provide a lower motional resistance $R_x$ at a given resonance frequency $f_0$ than is possible with the single-mass device 10 of FIG. 4D.

The coupled MEM resonator 60 can also be optimized to reduce the uncertainty $\Delta f$ in the resonant frequency $f_0$ using the method 100 of the present invention. The coupled MEM resonator 60 comprises a first MEM resonator 62 and a second MEM resonator 64 both of which have a structure similar to that of FIG. 4D except that the mass 14 in each resonator 62 and 64 is suspended above the substrate 12 by only three anchors 16. The two resonators 62 and 64 are coupled together by a coupler 66 that connects a corner of each mass 14. Four input electrodes 22 are connected together in parallel to electrically drive the mass 14 in the MEM resonator 62 to oscillate at the resonant frequency $f_0$; and this oscillation is coupled via the coupler 66 to the second MEM resonator 64 to drive the mass 14 therein to oscillate at substantially the same resonant frequency $f_0$. Four output electrodes 24 are provided in the second MEM resonator 64 and connected in parallel to provide an oscillatory electrical output signal from sensing the oscillating mass 14 in the second MEM resonator 64.

In the example of FIG. 6, the sizes and spacings of the holes 46 used to minimize the uncertainty $\Delta f$ in the resonant frequency $f_0$ can be different from the sizes and spacings of the holes 46 in the MEM resonator 10 of FIG. 4D, and can be learned from practice of the method 100 of the present invention. Additionally, the length of the coupler 66 can be selected to provide an optimum coupling between the two MEM resonators 62 and 64 using a parametric computational model of the coupled MEM resonator 60.

Those skilled in the art will understand that a coupled MEM resonator can also be formed with a pair of circular masses 14 by coupling together two MEM resonators 10 having a design similar to that shown in FIG. 4C. Those skilled in the art will also understand that a coupled MEM resonator can be formed with more than two masses 14. As an example, one or more additional masses 14 can be connected to the two masses 14 shown in FIG. 6 using additional couplers 66 to replace the anchors 16 in FIG. 6. When three or more masses 14 are coupled together to form the coupled MEM resonator, the masses 14 can be connected in different ways. As an example, a coupled MEM resonator having three suspended masses 14 can be formed by adding a third mass 14 between the masses 14 in the MEM resonators 62 and 64 in FIG. 6, with the masses 14 all being connected together in series by couplers 66 formed on two opposite corners of the third mass 14. As another example, another MEM resonator 64 and coupler 66 could be connected to one of the corners of the mass 14 in the MEM resonator 62 replacing the anchor 16 and anchor post 18 so that the MEM resonator 62 would drive the two MEM resonators 64 in parallel. Such coupled MEM resonators having three or more masses 14 are useful, for example, to form filters.

Figure 7A:
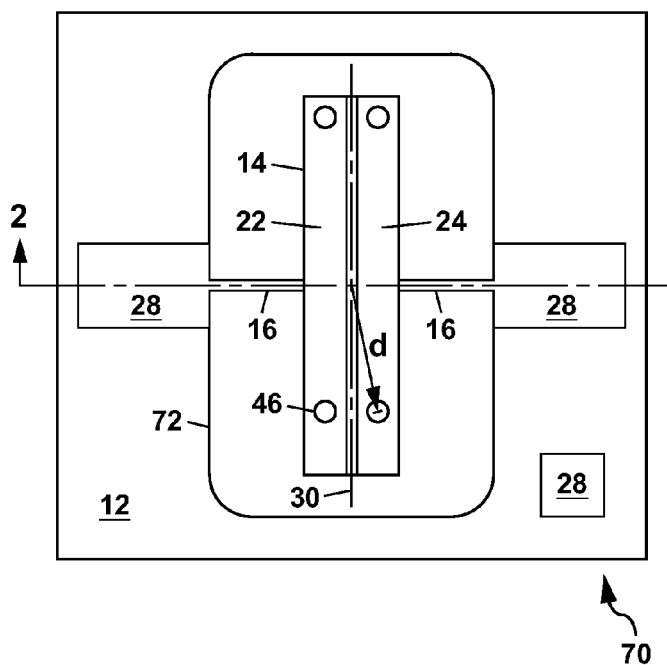
FIG. 7A shows a schematic plan view of a length-extensional MEM resonator according to the present invention.
Figure 7B:
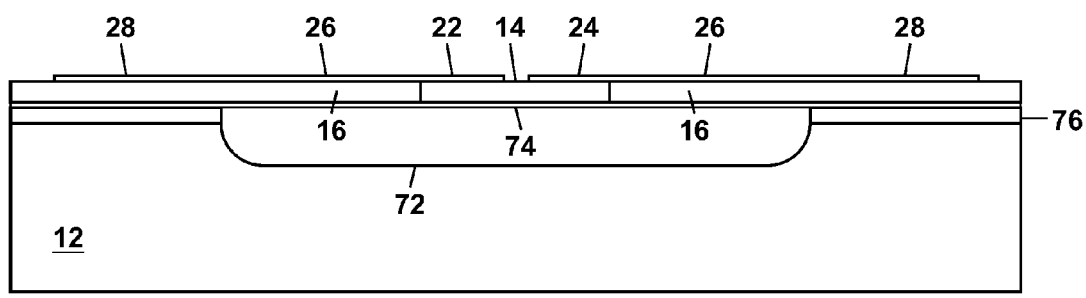
FIG. 7B shows an enlarged cross-section view of the device of FIG. 7A along the section line 2-2.

The method 100 of the present invention can also be applied to other types of MEM resonators as known to the art, including length-extensional resonators, and beam resonators. FIG. 7A shows a schematic plan view of an example of a length-extensional MEM resonator 70 that can be formed according to the present invention. FIG. 7B shows an enlarged cross-section view of the device 70 of FIG. 7A along the section line 2-2 in FIG. 7A. The length-extensional MEM resonator 70 of FIGS. 7A and 7B has a pattern of holes 46 formed according to the method 100 of the present invention to improve the manufacturability of the MEM resonator 10 by minimizing the uncertainty $\Delta f$ in the resonant frequency $f_0$.

In the example of FIGS. 7A and 7B, the length-extensional MEM resonator 70 comprises a rectangular mass 14 which is suspended by a pair of anchors 16 (also termed tethers) above a well 72 formed in a substrate 12. The anchors 16 can each be one-quarter acoustic wavelength long to acoustically isolate the mass 14 from the substrate 12, and can also be located at nodes in the displacement of the mass 14. The MEM resonator 70 in FIGS. 7A and 7B oscillates in a fundamental length-extensional mode which is characterized by dilation and contraction along the axis of movement 30, with exact length of the mass 14 defining the resonant frequency $f_0$. As an example, the mass 14 can have a length of 100-200 µm, and a width of 10-50 µm.

An input electrode 22 can be provided on one side of the top of the mass 14 as shown in FIGS. 7A and 7B; and an output electrode 24 can be located on the other side of the top of the mass 14. Each electrode 22 and 24 can be connected through wiring 26 formed on top of the anchors 16 to a contact pad 28 on the substrate 12. Another contact pad 28 can be connected to a ground plane 74 formed on the bottom of the mass 14 and the anchors 16 as shown in FIG. 7B. The ground plane 74 can be electrically insulated from the substrate 12 by an electrically-insulating layer 76. An extensional mode MEM resonator can also be formed using the same structure shown in FIGS. 7A and 7B by changing the shape of the electrodes 22 and 24 to stimulate a dilation and contraction in the width of the mass 14 instead of the length.

In the length-extensional MEM resonator 70 of FIGS. 7A and 7B, the substrate 12 can comprise, for example, silicon. The electrically-insulating layer 76 can comprise a few hundred nanometers of silicon dioxide or silicon nitride, or both. The electrical ground plane 74 can comprise a sandwich of sputter-deposited metals comprising a layer of titanium about 50 nanometers thick, followed by a layer of titanium nitride about 20 nanometers thick, and a layer of aluminum about 50 nanometers thick.

The mass 14 can comprise a piezoelectric material such as aluminum nitride (AlN), zinc oxide (ZnO) or PZT (PbZr$_x$Ti$_{1-x}$O$_3$) having a thickness of, for example, 0.75-1 µm. Methods for depositing AlN, ZnO and PZT, which include sputter deposition, are well known in the art. The same piezoelectric material can be used to form the anchors 16. A layer of aluminum about 200 nm thick can be sputter deposited over the substrate 12 and patterned to form the electrodes 22 and 24, the wiring 26 and the contact pads 28.

The various elements of the length-extensional MEM resonator 70 including the mass 14, anchors 16 and electrodes 22 and 24 can be patterned using reactive ion etching. Reactive ion etching can also be used to form a pattern of holes 46 into the mass 14, with each hole 46 being located at substantially the same distance from the center of the mass 14 and with all the holes 46 being of substantially the same size. The holes 46 are also oriented symmetrically about the axis of movement 30 of the mass 14 in the length-extensional mode. The size and location of the holes 46 can be defined according to the method 100 of the present invention using a parametric computational model of the MEM resonator 70. This pattern of holes 46 provided in the mass 14 can reduce the uncertainty $\Delta f$ in the resonant frequency $f_0$ due to the edge bias in the mass 14.

In the example of FIGS. 7A and 7B, the well 72 can be isotropically etched into the silicon substrate 12 using a dry SF$_6$ plasma through an opening formed in an etch mask (not shown) provided over the substrate 12. The SF$_6$ plasma isotropically etches the silicon while not substantially etching any of the other exposed elements of the MEM resonator 70 which are not made of silicon.

The MEM resonators 10, 60 and 70 of the present invention can be used as oscillators or as filters, or to form a filter bank. Such a filter bank can be formed by locating a plurality of MEM resonators 10, 60 or 70 side-by-side on a common substrate 12. The filter bank can be used perform a band selection (i.e. channel selection) for an input signal by switching the input signal from one MEM resonator 10, 60 or 70 to another MEM resonator, with each MEM resonator 10, 60, or 70 having a different predetermined resonant frequency $f_0$ corresponding to a particular band. As an example, for a multi-band transceiver incorporating the MEM resonators 10, 60 or 70, the various bands could include a 900 MHz cellular telephone band, a 1.9 GHz cellular telephone band, a 2.4 GHz wireless local area network (WLAN) band, and a 5.4 GHz WLAN band.

Those skilled in the art will understand that, although the method 100 of the present invention has been described for minimizing the uncertainty $\Delta f$ in the resonant frequency $f_0$ of MEM resonators 10 formed by surface micromachining with a mass 14 formed from polysilicon or a piezoelectric material, this method 100 can be applied to any type MEM resonator known to the art wherein uncertainty parameters are present and affect the uncertainty $\Delta f$ in the resonant frequency $f_0$. For example, the method 100 of the present invention can be applied to MEM resonators formed from a silicon-on-insulator substrate with a mass comprising monocrystalline silicon, or to MEM resonators fabricated on other types of substrates including Group IV, II-VI or III-V semiconductor materials (e.g. germanium, or gallium arsenide), sapphire, diamond, glass, quartz, fused silica, ceramic, etc.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A microelectromechanical (MEM) resonator, comprising:
    a substrate;
    a mass having a plurality of holes therein and suspended above the substrate by at least one anchor to oscillate at a resonant frequency $f_0$, with every hole in the mass having a location at substantially the same distance from a center of the mass, and with every hole in the mass having a hole size which is substantially identical, and with the hole location and the hole size being defined to compensate, at least in part, for an uncertainty $\Delta f$ in the resonant frequency $f_0$;
    a first set of electrodes located proximate to the mass to electrically stimulate the mass to oscillate at the resonant frequency $f_0$; and
    a second set of electrodes located proximate to the mass to sense the oscillation at the resonant frequency $f_0$.

2. The MEM resonator of claim 1 wherein every hole is located symmetrically about an axis of displacement of the mass.

3. The MEM resonator of claim 1 wherein the at least one anchor comprises four anchors equally spaced about the mass.

4. The MEM resonator of claim 1 wherein the at least one anchor comprises a single anchor located beneath the center of the mass.

5. The MEM resonator of claim 1 wherein the at least one anchor comprises two anchors located on opposite sides of a rectangular mass.

6. The MEM resonator of claim 1 wherein the mass is square or circular.

7. The MEM resonator of claim 1 wherein all the holes are circular.

8. The MEM resonator of claim 1 wherein the uncertainty $\Delta f$ in the resonant frequency $f_0$ is due to at least one uncertainty parameter selected from the group consisting of an edge bias of the mass, a variation in thickness of the mass, a misalignment of the at least one anchor with respect to an axis of symmetry of the mass, a value of Young's modulus for a material used to form the MEM resonator, a value of Poisson's ratio for the material used to form the MEM resonator, and a density of the material used to form the MEM resonator.

9. A microelectromechanical (MEM) resonator comprising:
    a mass suspended above a substrate by at least one anchor and having a first set of holes which are all of a first size, and having a second set of holes which are all of a second size which is different from the first size, and with the sizes and locations of the first and second sets of holes being defined to provide an oscillation of the mass at a resonant frequency $f_0$ which is substantially independent of an edge bias in the MEM resonator;
    a first set of electrodes located on the substrate to electrically stimulate the oscillation of the mass at the resonant frequency $f_0$; and
    a second set of electrodes located on the substrate to sense the oscillation at the resonant frequency $f_0$.

10. The MEM resonator of claim 9 wherein the first set of holes is rotated relative to the second set of holes by an angle which is substantially equal to 45 degrees.

11. The MEM resonator of claim 9 wherein the first set of holes is spaced at a first distance from a center of the mass which is different from a second distance from the center of the mass where the second set of holes is located.

12. The MEM resonator of claim 9 wherein all the holes in the first and second sets of holes are circular in shape.

13. The MEM resonator of claim 9 wherein all the holes in the first and second sets of holes are located symmetrically about an axis of displacement of the mass.

14. The MEM resonator of claim 9 wherein the first set of holes consists of four holes, and the second set of holes consists of four holes.

15. The MEM resonator of claim 9 wherein the at least one anchor comprises a single anchor located beneath the center of the mass to suspend the mass above the substrate.

16. The MEM resonator of claim 9 wherein the at least one anchor comprises four anchors equally spaced about a periphery of the mass to suspend the mass above the substrate.

17. The MEM resonator of claim 9 wherein the mass is square, and the at least one anchor comprises three anchors connected to the square mass at three corners thereof, with a fourth corner of the square mass being connected by a coupler to another square mass which is suspended above the substrate with the second set of electrodes being formed thereabout.

18. The MEM resonator of claim 9 wherein the mass is circular or square in shape.

19. The MEM resonator of claim 9 wherein the MEM resonator is selected from the group of MEM resonators consisting of Lamé resonators, wineglass resonators and extensional resonators.

* * * * *